(12) United States Patent
Tilton et al.

(10) Patent No.: US 9,515,457 B2
(45) Date of Patent: Dec. 6, 2016

(54) ANGLED FACET BROAD-RIDGE QUANTUM CASCADE LASER

(71) Applicant: The Boeing Company, Chicago, IL (US)

(72) Inventors: Michael Lee Tilton, Albuquerque, NM (US); Gregory C. Dente, Albuquerque, NM (US)

(73) Assignee: The Boeing Company, Chicago, IL (US)

( * ) Notice: Subject to any disclaimer, the term of this patent is extended or adjusted under 35 U.S.C. 154(b) by 486 days.

(21) Appl. No.: 14/078,325

(22) Filed: Nov. 12, 2013

(65) Prior Publication Data

US 2016/0322785 A1    Nov. 3, 2016

(51) Int. Cl.
    *H01S 5/34*      (2006.01)
    *H01S 5/028*      (2006.01)
    *H01S 5/062*      (2006.01)
    *H01S 5/20*      (2006.01)
    *H01S 5/22*      (2006.01)

(52) U.S. Cl.
CPC ............ *H01S 5/3401* (2013.01); *H01S 5/028* (2013.01); *H01S 5/0287* (2013.01); *H01S 5/0624* (2013.01); *H01S 5/2018* (2013.01); *H01S 5/22* (2013.01)

(58) Field of Classification Search
CPC .... H01S 5/028; H01S 5/0287; H01S 5/0624; H01S 5/2018; H01S 5/22; H01S 5/3401
See application file for complete search history.

(56) References Cited

U.S. PATENT DOCUMENTS

| | | | |
|---|---|---|---|
| 6,214,178 B1 * | 4/2001 | Chakrabarti | H01S 5/028 204/192.34 |
| 2009/0224958 A1 * | 9/2009 | Aphek | F41G 7/224 342/54 |

OTHER PUBLICATIONS

Hensley et al., Demonstration of an External Cavity Terahertz Quantum Cascade Laser, presented at Optical Terahertz Science and Technology Meeting; Mar. 2005, Orlando, FL; Optical Society of America.*
Bai et al., High power broad area quantum cascade lasers, Applied Physics Letters; Dec. 2009, American Institute of Physics.
Gökden et al., High-brightness tapered quantum cascade lasers, Applied Physics Letters; Feb. 2013, American Institute of Physics.
Vurgaftman et al., Photonic-Crystal Distributed-Feedback Quantum Cascade Lasers, IEEE Journal of Quantum Electronics, vol. 38, No. 6, Jun. 2002.
Bai et al., Electrically pumped photonic crystal distributed feedback quantum cascade lasers, Applied Physics Letters; Oct. 2007, American Institute of Physics.
Lu et al., Room temperature operation of photonic-crystal distributed-feedback quantum cascade lasers with single longitudinal and lateral mode performance, Applied Physics Letters; Feb. 2010, American Institute of Physics.
Gökden et al., Broad area photonic crystal distributed feedback quantum cascade lasers emitting 34 W at λ 4.36μm, Applied Physics Letters; Oct. 2010, American Institute of Physics.
Bai et al., Angled cavity broad area quantum cascade lasers, Applied Physics Letters; Aug. 2012, American Institute of Physics.

* cited by examiner

*Primary Examiner* — Armando Rodriguez
(74) *Attorney, Agent, or Firm* — Toler Law Group, P.C.

(57) ABSTRACT

A particular quantum cascade laser includes a ridge-guide. The ridge-guide includes an angled facet that extends across a width of the ridge-guide and a flat facet that extends across the width of the ridge-guide. A first distance between the flat facet and the angled facet along a first side of the ridge-guide is different than a second distance between the flat facet and the angled facet along a second side of the ridge-guide.

22 Claims, 7 Drawing Sheets

FIG. 8

ANGLED FACET BROAD-RIDGE QUANTUM CASCADE LASER

I. FIELD OF THE DISCLOSURE

The present disclosure is generally related to an angled facet broad-ridge Quantum Cascade Laser.

II. BACKGROUND

Quantum Cascade Lasers (QCLs) are capable of producing room temperature outputs at wavelengths not easily accessible by other laser sources. Narrow-ridge QCL devices, with ridge widths of less than ten microns, have demonstrated lateral mode control while being limited in output power; they are therefore well-suited for lower power applications. One way to increase power from a QCL device is to broaden the ridge and contact, leading to mode competition between higher-order lateral modes and degraded lateral farfields. As the ridge and injection contact widths are increased, the laser begins to operate in a mixture of higher-order lateral modes across the ridge width. Additionally, the lasing lateral farfield forms a dual-lobed pattern that remains relatively stable with nearly fixed angular separation for the lobes. Further, for devices processed with sloped ridge walls, the observed angular separation of the lobes is essentially independent of the ridge width as the width exceeds about fifty microns.

III. SUMMARY

Disclosed herein are embodiments of an angled facet (AF) quantum cascade laser (QCL). The AF-QCL may include a broad-ridge-guide that includes one angled facet and one flat facet that is high-reflection coated. The AF-QCL may cause output light emitted from the angled facet to form a single, laterally coherent, nearly diffraction-limited beam in the farfield. The AF-QCL may provide a high brightness output as compared to a broad-ridge QCL having two flat facets (i.e., a flat facet FF-QCL). In addition, as compared to a QCL having two angled facets (DAF-QCL), the AF-QCL may lead to a doubling of output efficiency. For purposes of comparison, emissions from one facet are considered, while the other facet has a high-reflection coating.

In a particular embodiment, a quantum cascade laser includes a ridge-guide. The ridge-guide includes one angled facet that extends across a width of one end of the ridge-guide and one flat facet that extends across the width of the other end of the ridge-guide. A first distance between the flat facet and the angled facet along a first side of the ridge-guide is different than a second distance between the flat facet and the angled facet along a second side of the ridge-guide.

In another particular embodiment, a method includes injecting current into the ridge-guide of a quantum cascade laser, where the ridge-guide includes a flat facet that extends across a width of the ridge-guide and an angled facet that extends across the width of the ridge-guide. The method further includes emitting output light from the angled facet of the ridge-guide in response to the injected current.

In another particular embodiment an infrared countermeasure (IRCM) system includes a warning sensor configured to detect a threat. The IRCM system further includes a tracking sensor configured, in response to receiving a threat indicator from the warning sensor, to acquire a position of the threat and to track the position of the threat. The IRCM system further includes an angled facet quantum cascade laser (AF-QCL) configured to transmit output light energy to the position of the threat based on a tracking signal received from the tracking sensor. The AF-QCL includes a ridge-guide. The ridge-guide includes one angled facet that extends across a width of one end of the ridge-guide and one flat facet that extends across the width of the other end of the ridge-guide. A first distance between the flat facet and the angled facet along a first side of the ridge-guide is different than a second distance between the flat facet and the angled facet along a second side of the ridge-guide.

One particular advantage provided by at least one of the disclosed embodiments is that output light emitted from an angled facet (AF) quantum cascade laser (QCL) may form a nearly diffraction-limited, single-lobe in the lateral farfield axis centered on the direction perpendicular to the angled facet. A farfield lateral axis power efficiency corresponding to the single lobe may be greater than a power efficiency corresponding to a particular lobe of a dual-lobed output of a broad-ridge QCL that includes two flat facets (e.g., a flat facet FF-QCL). Further, the farfield lateral axis power efficiency corresponding to the single lobe may be greater than a power efficiency corresponding to a lobe of a broad-ridge QCL that includes two angled facets (DAF-QCL). An AF-QCL may be configured to provide a greater farfield lateral axis output brightness based on a particular injected current, as compared to a broad-ridge QCL that includes two flat facets, or as compared to a broad-ridge QCL that includes two angled facets. For purposes of comparing an AF-QCL to a DAF-QCL and comparing an AF-QCL to a FF-QCL, emissions from one facet are considered, while the other facet has a high-reflection coating.

Other aspects, advantages, and features of the present disclosure will become apparent after review of the entire application, including the following sections: Brief Description of the Drawings, Detailed Description, and the Claims.

V. DETAILED DESCRIPTION

Particular embodiments of the present disclosure are described below with reference to the drawings. In the description, common features are designated by common reference numbers throughout the drawings.

Figure 1:
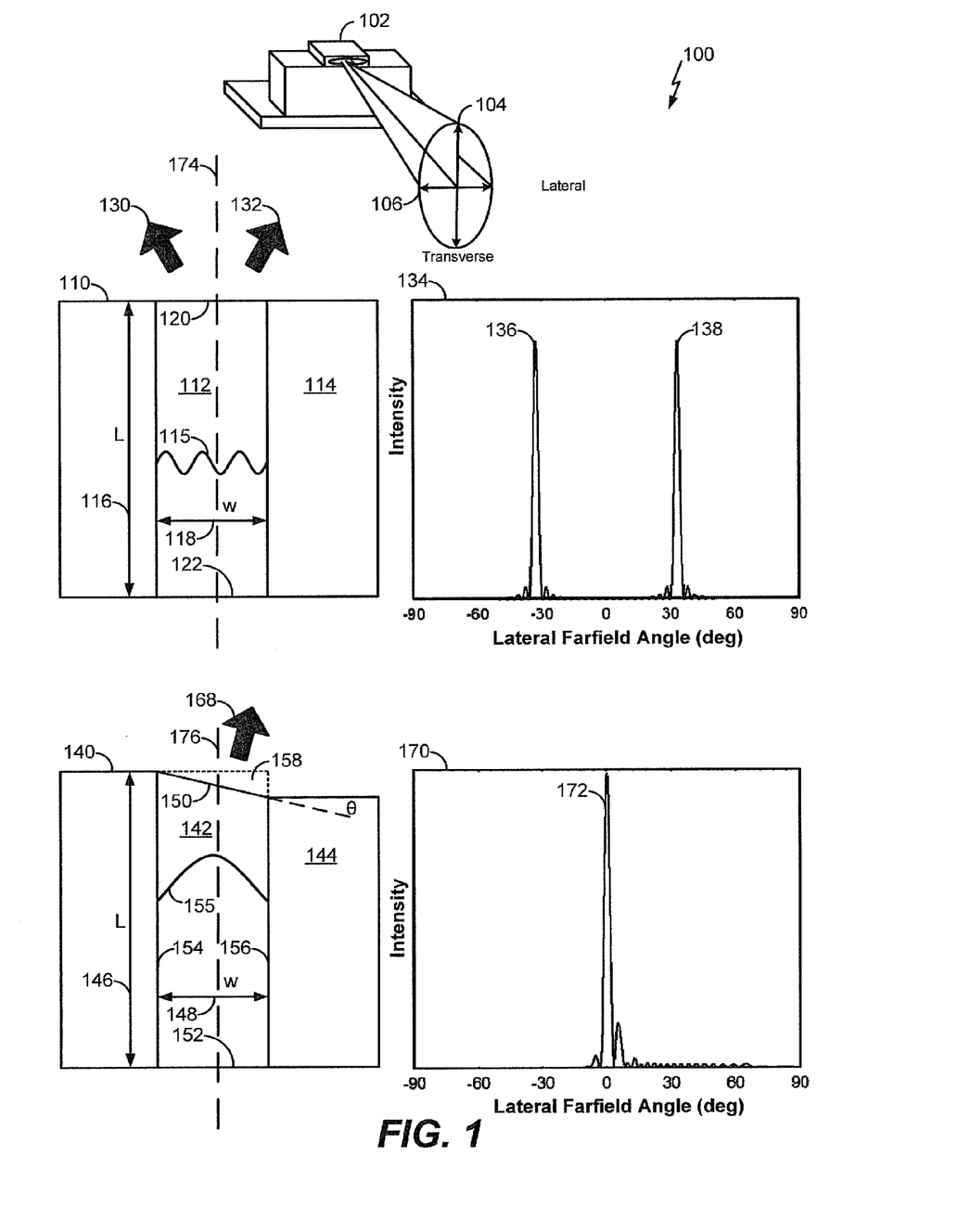
FIG. 1 is a diagram illustrating both an angled facet quantum cascade laser and a flat facet quantum cascade laser along with farfield intensity profiles provided by each.

Referring to FIG. 1, an illustrative diagram 100 including a quantum cascade laser (QCL) 102 and a comparison between a flat facet QCL (FF-QCL) 110 and an angled facet QCL (AF-QCL) 140 is shown. In FIG. 1, a first diagram 134 illustrates simulated output intensity of first and second output light lobes 136, 138 (e.g., peaks) of the FF-QCL 110 at particular farfield angles. In FIG. 1, a second diagram 170 illustrates simulated output intensity of an output light lobe 172 (e.g., peak) of the AF-QCL 140 at particular farfield angles.

The QCL 102 is shown in a perspective view to illustrate reference directions described with respect to the FF-QCL 110, the AF-QCL 140, and the diagrams 134 and 170. The QCL 102 may correspond to the FF-QCL 110 or to the AF-QCL 140. Output of the QCL 102 may include light projected in a transverse direction 104 and a lateral direction 106.

The FF-QCL 110 includes a substrate 114 and a ridge-guide 112 coupled to the substrate 114. The substrate 114 and the ridge-guide 112 may each have a length (L) 116. The ridge-guide 112 may have a width (w) 118. The ridge-guide 112 may include a first flat facet 120 and a second flat facet 122 that extend across the width (w) 118 of the ridge-guide 112.

When a current is applied to the ridge-guide 112 (e.g., by a current source), a lateral standing wave 115 may be formed inside the ridge-guide 112. The lateral standing wave 115 may extend between the edges of the ridge guide 112.

The ridge-guide 112 may emit light corresponding to the lateral standing wave. The output light may be emitted from the first flat facet 120 in a first direction 130 (e.g., about −35 deg from an axis 174 of the ridge-guide 112) and in a second direction 132 (e.g., about +38 deg from the axis 174 of the ridge-guide 112). Thus, the output light forms a first near diffraction limited lobe in a farfield in the first direction 130 (e.g., corresponding to the first output light lobe 136) and a second near diffraction limited lobe in the farfield in the second direction 132 (e.g., corresponding to the second output light lobe 138). The first near diffraction limited lobe and the second near diffraction limited lobe may be formed in the farfield in a direction that extends across the width (w) 118 of the ridge-guide 112 (e.g., along the lateral direction 106 as described above).

The AF-QCL 140 includes a substrate 144 and a ridge-guide 142 coupled to the substrate 144. In a particular embodiment, the substrate 144 and a first side 154 of the ridge-guide 142 may each have a length (L) 146. In another particular embodiment, the substrate 144 and the first side 154 of the ridge-guide 142 have different lengths. The ridge-guide 142 may have a width (w) 148.

The ridge-guide 142 may include an angled facet 150, a flat facet 152, the first side 154, and a second side 156. The angled facet 150 may be formed at an angle (θ) 158 (e.g., about 11 degrees from a plane perpendicular to an axis 176 of the ridge-guide 142), as compared to the flat facet 152. The angled facet 150 and the flat facet 152 may extend across the width (w) 148 of the ridge-guide 142. The length of the first side 154 may be different than a length of the second side 156. For example, the first side 154 may have a length of about 0.2826 cm, the second side 156 may have a length of about 0.2806 cm, and the angle (θ) 158 may be about 11 degrees. Due to the angle (θ) 158, the angled facet 150 may extend in a direction across the width (w) 148 of the ridge-guide 142 (e.g., along the lateral direction 106 as described above) that is perpendicular to the axis 176. In a particular embodiment, the angled facet 150 is formed by removing a portion 158 of the ridge-guide 142. The portion 158 may be removed using a focused ion-milling process, an etching process, or a combination thereof.

When a current is injected into the ridge-guide 142, a lateral standing wave 155 may be formed inside the ridge-guide 142 (e.g., between the first side 154 and the second side 156). The lateral standing wave 155 may extend between the edges of the ridge guide 142. The angled facet 150, as described further with reference to FIG. 2, may promote lateral mode filtering causing the device to run in a single lateral mode.

The angled facet 150 may be configured to emit output light corresponding to the lateral standing wave 155 in a direction 168. The direction 168 may be at an angle relative to the axis 176 of the ridge-guide 142. In a particular embodiment, the output light of the AF-QCL 140 forms a single, nearly diffraction-limited lobe in a farfield corresponding to the direction 168 (e.g., corresponding to the output light lobe 172). The nearly diffraction-limited lobe may be formed in the farfield in a direction that extends across the width (w) 148 of the ridge-guide 142 (e.g., along the lateral direction 106 as described above).

The substrate 144 may be formed of indium phosphide (InP), gallium antimonide (GaSb), or indium arsenide (InAs). A surface of the ridge-guide 142 opposite the substrate 144 may be gold plated. The flat facet 152 of the AF-QCL 140 may be coated with a high-reflection coating. The angled facet 150 of the AF-QCL 140 may be coated with an anti-reflection coating.

When a current is applied to the FF-QCL 110, the ridge-guide 112 may emit two nearly diffraction-limited lobes in the farfield in the lateral direction 106, diverging from each other at angles corresponding to 136 and 138. When a current is applied to the AF-QCL 140, the ridge-guide 142 may emit a single nearly diffraction-limited lobe in the farfield in the lateral direction 106 (e.g., output light corresponding to the two nearly diffraction-limited lobes of the FF-QCL 110 may be combined into a single lobe). The AF-QCL 140 may emit output light having increased power in a single lobe as compared to the FF-QCL 110.

Figure 2:
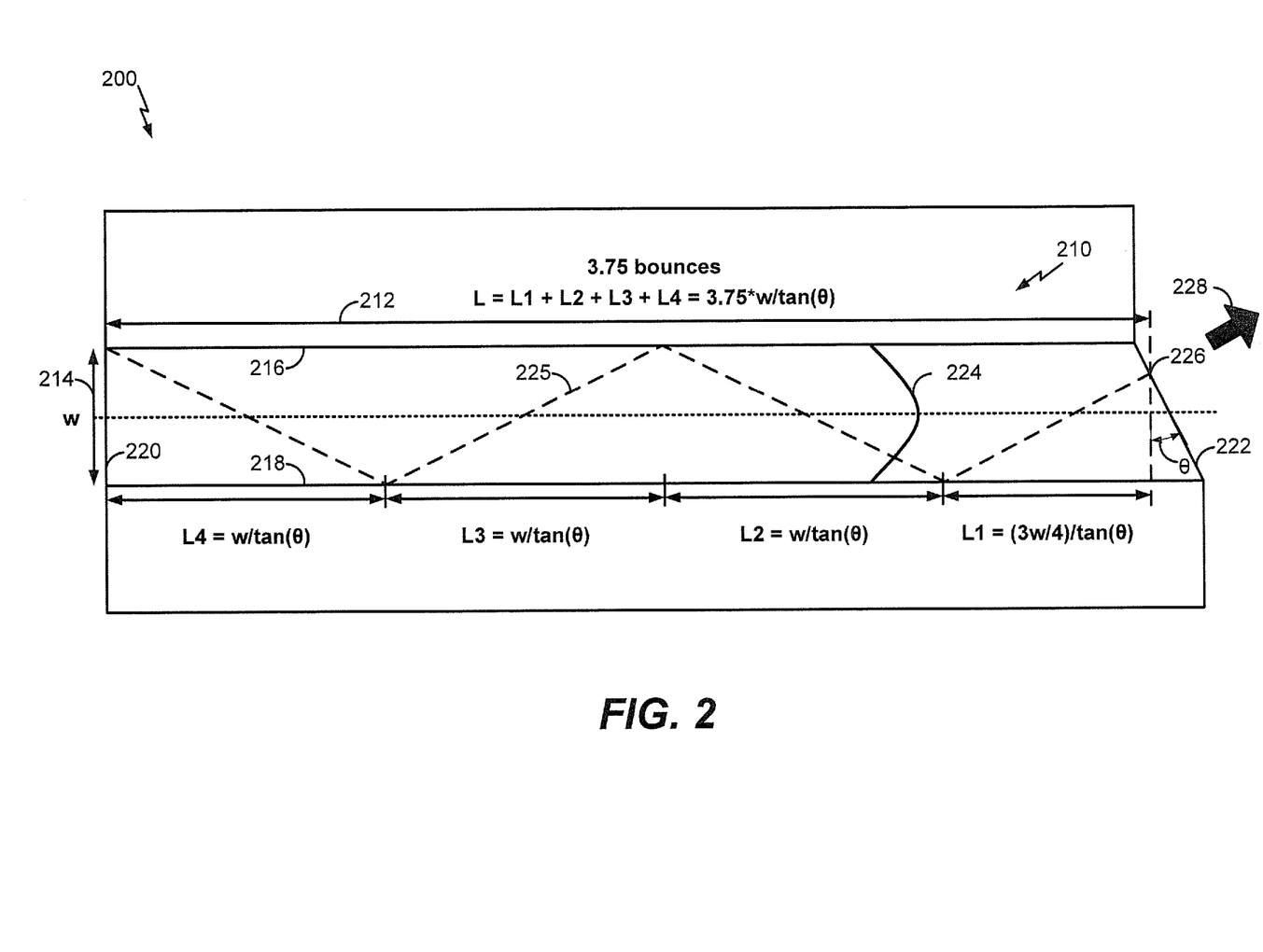
FIG. 2 is a diagram illustrating a particular embodiment of a ridge-guide of an angled facet quantum cascade laser.

Referring to FIG. 2, an illustrative diagram 200 including a top view of a particular embodiment of a ridge-guide 210 of an angled facet quantum cascade laser (AF-QCL) is shown. The ridge-guide 210 may correspond to a ridge-guide of the QCL 102 of FIG. 1, to the ridge-guide 142 of the AF-QCL 140 of FIG. 1, or to both.

The ridge-guide 210 includes a first side 216, a second side 218, a flat facet 220, and an angled facet 222. The ridge-guide 210 may have a width (w) 214. The flat facet 220 and the angled facet 222 may extend across the width (w) 214. The angled facet 222 may be formed at an angle (θ) (e.g., about 11 degrees). A first distance between the flat facet 220 and the angled facet 222 along the first side 216 may be different from a second distance between the flat facet 220 and the angled facet 222 along the second side 218.

When a current is applied to the ridge-guide 210, the ridge-guide 210 may generate an optical standing wave 224 inside the ridge-guide 210. The ridge-guide 210 may emit a single nearly diffraction-limited lobe of output light in a lateral direction 228 from the angled facet 222. The optical standing wave 224 may reflect off the first side 216 and reflect off the second side 218. The optical standing wave 224 may reflect off the flat facet 220, the first side 216, and the second side 218 at a reflection angle that is equal to the angle (θ) or to another angle. Dimensions of the ridge-guide 210 (e.g., a length of the first side 216, a length of the second side 218, the width (w) 214, and the angle (θ)) may be selected to cause the optical standing wave 224 to have a particular number of bounces between the flat facet 220 and the angled facet 222, where each bounce corresponds to a path of the optical standing wave 224 traversing the width (w) 214 of the ridge-guide 210. The ridge-guide 210 may have a length (L) 212 equal to the number of bounces (b) multiplied by the width (w) 214 of the ridge-guide 210 divided by a tangent of the reflection angle (e.g., θ). The total angled propagation path length (APPL) 225 of the optical standing wave 224 may be determined according to the formula:

$$APPL = \frac{\# \cdot \lambda}{2 \cdot n}$$

Where # represents an integer number, λ represents a free space wavelength of light that forms the optical standing wave 224 (e.g. 4.95 micrometers (μm)), n represents an average modal index of refraction of a material used to form the angled ridge guide 210.

The angle θ of the angled facet 222 may be determined according to a formula:

$$\sin \theta = (m^* \lambda)/(2^* n^* w)$$

Where θ represents the angle of the angled facet 222 (e.g., 11 degrees in the embodiment illustrated in FIG. 2), m represents a mode number of a lateral mode of the ridge-guide 210 (e.g., 24), λ represents a free space wavelength of light that forms the optical standing wave 224 (e.g., 4.95 micrometers (μm)), n represents an average modal index of refraction of a material used to form the angled facet 222 (e.g., 3.1), and w represents the width (w) 214 of the ridge-guide 210 (e.g., 100 μm).

The optical standing wave 224 may intersect with the angled facet 222 at an intersection point 226 located between the first side 216 and the second side 218. An output intensity associated with the single nearly diffraction-limited lobe of output light in the lateral direction 228 may vary based on a location of the intersection point 226. In a particular embodiment, the optical standing wave 224 intersects with the angled facet 222 to form a right angle.

In the embodiment illustrated in FIG. 2, the optical standing wave 224 bounces 3.75 times between the flat facet 220 and the angled facet 222. For example, the first bounce corresponds to a first length L1, the second bounce corresponds to a second length L2, the third bounce corresponds to a third length L3, and the fourth bounce corresponds to a fourth length L4. The length (L) 212 may correspond to a sum of the lengths L1-L4. The first bounce may intersect with the angled facet 222 at a right angle located at the intersection point 226 approximately halfway between a midpoint of the width (w) 214 and the first side 216 (i.e., ¾ of the width (w) 214).

A portion of the optical standing wave 224 may be internally reflected and a portion of the optical standing wave 224 may be emitted as output light in the lateral direction 228 from the angled facet 222. The output light may form a single nearly diffraction-limited lobe in the far field. The single nearly diffraction-limited lobe of output light in the lateral direction 228 may have a particular farfield output intensity, as described further with reference to FIG. 3.

An AF-QCL (e.g., the AF-QCL 140 of FIG. 1) may form a single nearly diffraction-limited lobe in the farfield in a lateral axis. A farfield lateral axis power efficiency corresponding to the single nearly diffraction-limited lobe may be greater than a power efficiency corresponding to a particular lobe of a dual-lobed output of a QCL that includes two flat facets (e.g., the FF-QCL 110 of FIG. 1). Further, the farfield lateral axis power efficiency corresponding to the single nearly diffraction-limited lobe may be greater than a power efficiency corresponding to a lobe of a QCL that includes two angled facets.

Figure 3:
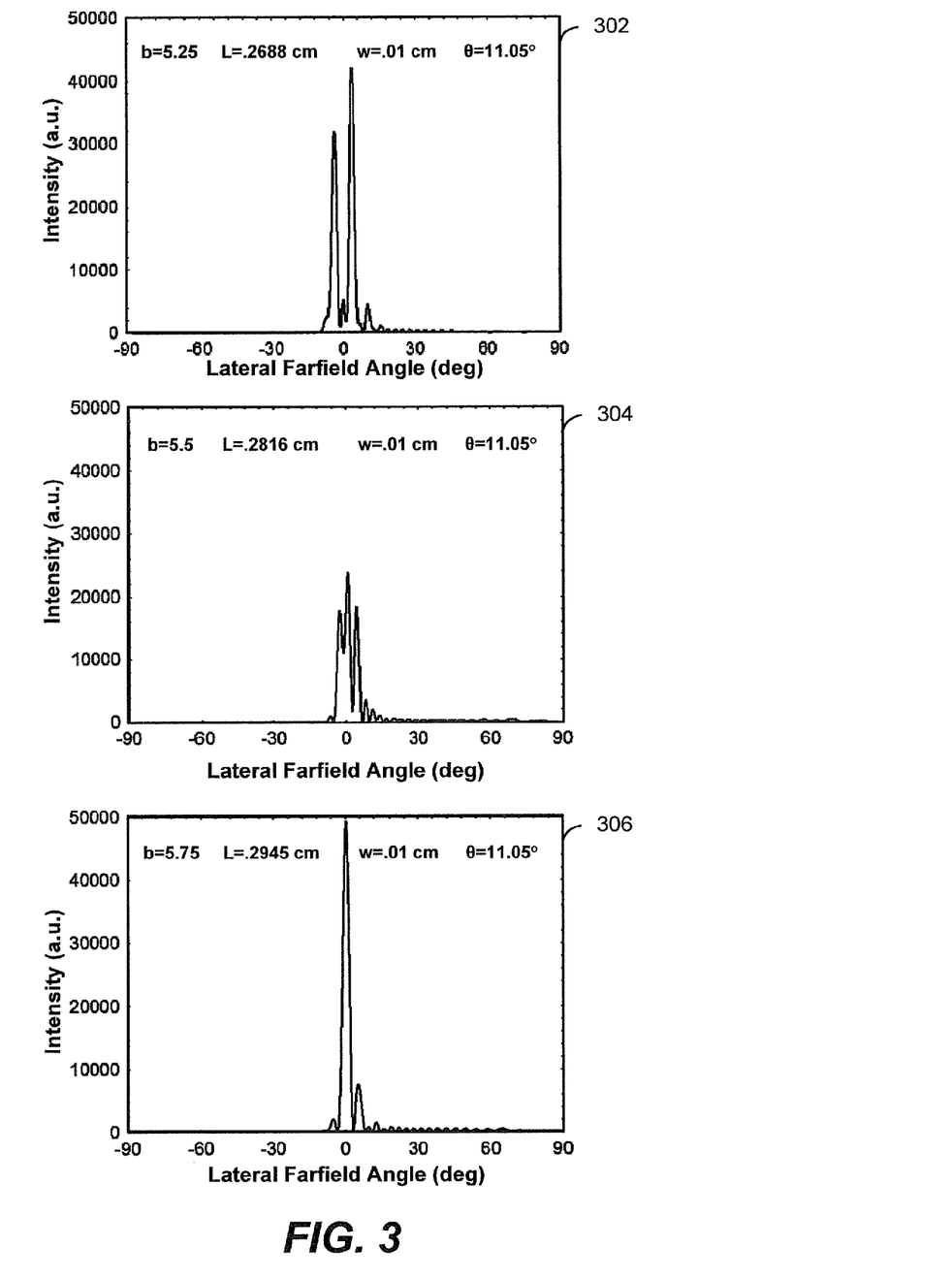
FIG. 3 is a diagram illustrating three diagrams of outputs of three particular embodiments of a quantum cascade laser.

Referring to FIG. 3, a first diagram 302, a second diagram 304, and a third diagram 306 are shown illustrating simulated farfield outputs of various angled facet quantum cascade lasers (AF-QCLs). The first diagram 302, the second diagram 304, and the third diagram 306 correspond to angled facet AF-QCLs having different dimensions. FIG. 3 illustrates varying dimensions of an AF-QCL to change a number of bounces (b) of an optical standing wave. To simulate the results shown in FIG. 3, a width (w) of a ridge-guide and an angle (θ) of an angled facet of the ridge-guide were held constant, and a length (L) of the ridge-guide was varied. However, since θ, w, and L are all related to the number of bounces, any one or more could be changed to change the number of bounces. For purposes of simulation, a width of 0.01 cm and an angle of about 11.05 degrees were used. The first diagram 302 corresponds to a first ridge-guide having a length (L) of 0.2688 cm and having an optical standing wave with 5.25 bounces (b). The second diagram 304 corresponds to a second ridge-guide having a length (L) of 0.2816 cm and having an optical standing wave with 5.5 bounces (b). The third diagram 306 corresponds to a third ridge-guide having a length (L) of 0.2945 cm and having an optical standing wave with 5.75 bounces (b). Half a bounce corresponds to an optical standing wave intersecting with an angled facet at a midpoint of a width of a corresponding ridge-guide. Although the diagrams 302, 304, and 306 show 5.25 bounces, 5.5 bounces, and 5.75 bounces, in other embodiments, different dimensions (e.g., θ, w, and L) may be selected such that other numbers of bounces (e.g., 8.75 bounces) may result.

As illustrated by the first diagram 302, the second diagram 304, and the third diagram 306, a farfield intensity associated with output light of an AF-QCL may be greater when an intersection point (e.g., the intersection point 226 of FIG. 2) is not at a midpoint of a width (e.g., the width (w) 214 of FIG. 2) of the ridge-guide. That is, when a fractional portion of a number of bounces is less than ½ or greater than ½ (e.g., when the fractional portion is ¼ or ¾).

Figure 4:
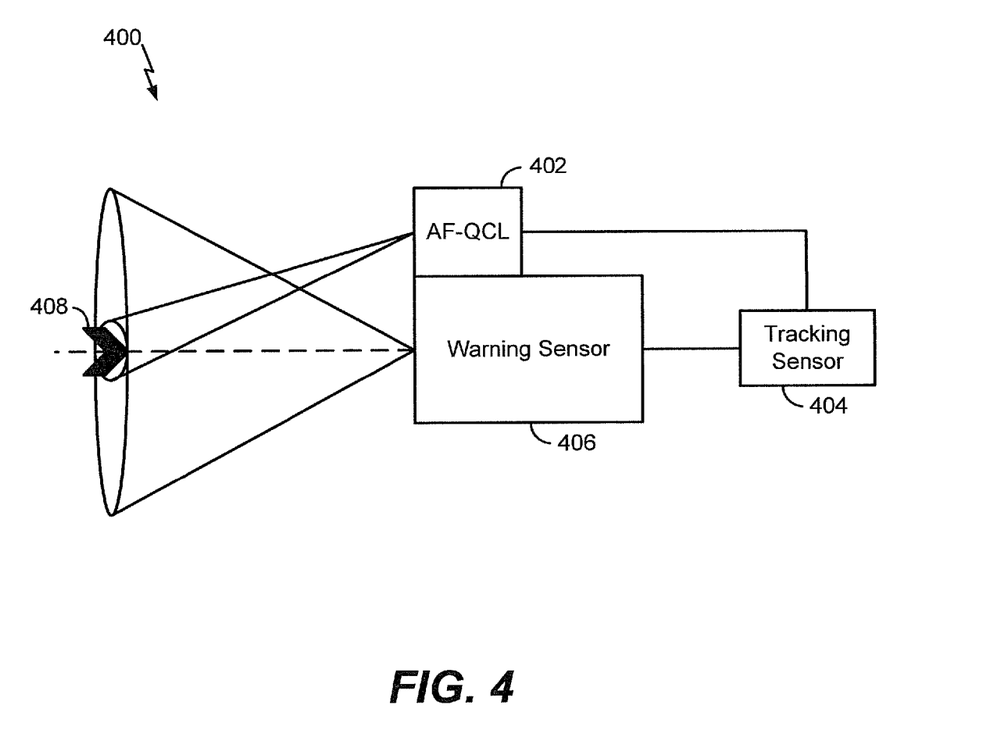
FIG. 4 is a block diagram illustrating a particular embodiment of an infrared countermeasure system that includes an angled facet quantum cascade laser.

FIG. 4 is a block diagram of an infrared countermeasure (IRCM) system 400 including an angled facet quantum cascade laser (AF-QCL) 402, a tracking sensor 404, and a warning sensor 406. The AF-QCL 402 may correspond to the AF-QCL 140 of FIG. 1, or to a QCL that includes the ridge-guide 210 of FIG. 2. The IRCM system 400 may be part of an aircraft (e.g., an airplane or a helicopter).

The warning sensor 406 may be configured to detect a threat 408. For example, threat 408 may be a missile (e.g., a heat-seeking missile) and the warning sensor 406 may be configured to detect a launch of the threat 408. The warning sensor 406 may be configured to transmit a threat launch indicator to the tracking sensor 404, indicating that the threat 408 has been detected. The tracking sensor 404 may be configured, in response to receiving the threat launch indicator, to acquire a position of the threat 408 and to track the position of the threat 408. The tracking sensor 404 may be further configured to transmit a tracking signal to the AF-QCL 402. The AF-QCL 402 may be configured to transmit output light energy to the position of the threat 408 based on the tracking signal. The AF-QCL 402 may be configured to transmit the output light energy in response to a firing command received from the warning sensor 406, from the tracking sensor 404, or from another device. In a particular embodiment, the output light may be configured to jam a targeting system of the threat 408.

Infrared countermeasure (IRCM) systems may be limited by the size and weight of their source transmitting components (e.g., light sources). Light sources used by some IRCM systems may be large and inefficient compared to typical diode lasers. A hurdle in developing mid-infrared diode lasers is the realization of high-power, near room temperature operation, which allows the size benefit of this technology to be realized. QCLs have already been demonstrated as potential room temperature, pulsed sources of Band IV radiation. However, coherent, high-power, high-brightness output from a flat facet QCL (FF-QCL) is still an issue, requiring substantial improvements in both internal laser efficiency and device design. An AF-QCL (e.g., the AF-QCL 402) can produce a laterally coherent, high-brightness, high-power, single beam output from a broad-area ridge waveguide QCL.

An AF-QCL (e.g., the AF-QCL 402) may be used for a variety of applications, including remote chemical sensing, free-space optical networks and infrared countermeasures, that utilize both high-power and high-brightness light sources. AF-QCL output power scales directly with the current injection stripe/ridge guide width. Beyond a certain ridge width (e.g., more than 20 micrometers (μm)), both spectral and spatial properties of a FF-QCL may be significantly degraded. Lasing farfields using a FF-QCL may show a distinctive dual-lobed pattern, as described above, with reference to FIG. 1. This dual-lobed output may be non-ideal for the applications mentioned above. The AF-QCL described herein provides a single-lobed output in the farfield, and therefore may be superior to a FF-QCL in many applications.

Figure 5:
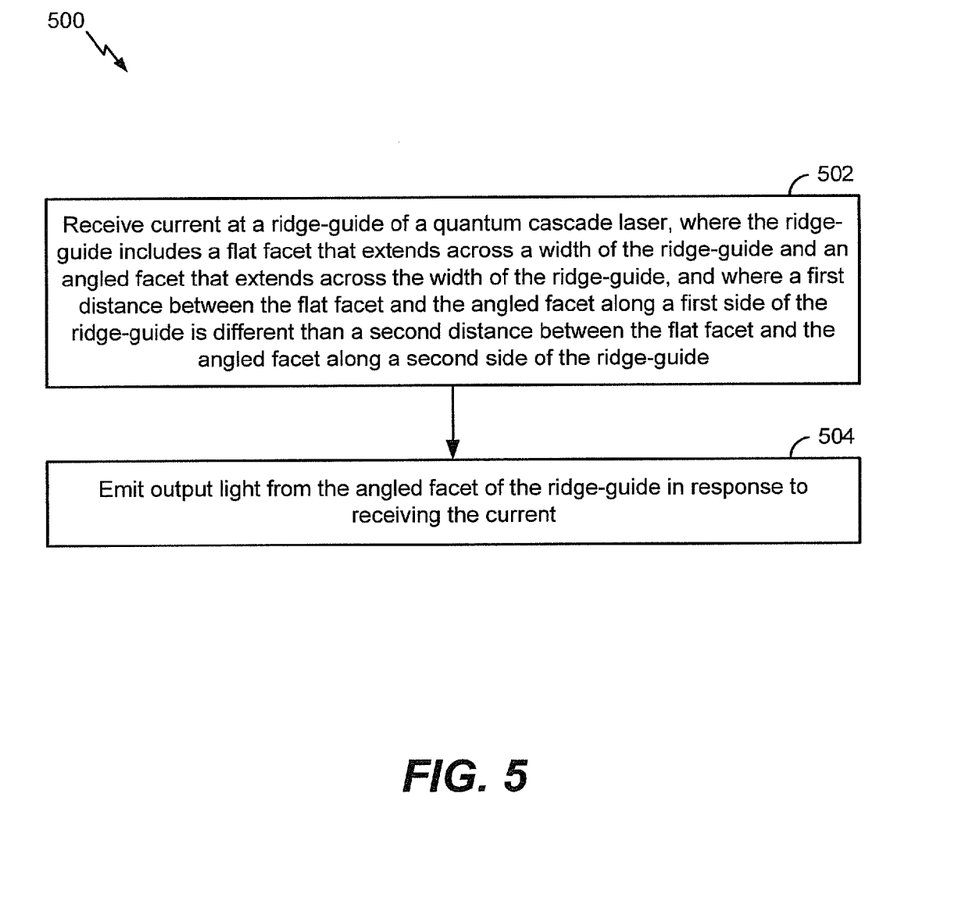
FIG. 5 is a flow chart illustrating a particular embodiment of a method of operating a quantum cascade laser.

FIG. 5 is a flow chart illustrating a particular embodiment of a method 500 of operating a quantum cascade laser. The method 500 includes, at 502, receiving current at a ridge-guide of a quantum cascade laser, where the ridge-guide includes a flat facet that extends across a width of the ridge-guide and an angled facet that extends across the width of the ridge-guide. A first distance between the flat facet and the angled facet along a first side of the ridge-guide is different than a second distance between the flat facet and the angled facet along a second side of the ridge-guide. For example, as described with reference to FIG. 1, current may be received (e.g., from a current source) at the ridge-guide 142 of the AF-QCL 140. The ridge-guide 142 includes the flat facet 152 that extends across the width (w) 148 of the ridge-guide 142 and the angled facet 150 that extends across the width (w) 148 of the ridge-guide 142. A first distance between the flat facet 152 and the angled facet 150 along the first side 154 of the ridge-guide 142 is different than a second distance between the between the flat facet 152 and the angled facet 150 along the second side 156 of the ridge-guide 142.

The method 500 further includes, at 504, emitting output light from the angled facet of the ridge-guide in response to receiving the current. For example, output light may be emitted from the angled facet 150 of the ridge-guide 142 (e.g., corresponding to the output light lobe 172) in response to receiving the current. The output light may be emitted with a single lobe (e.g., the output light lobe 172) in the far field in the lateral direction 106. Accordingly, a farfield lateral axis power efficiency corresponding to the single nearly diffraction-limited lobe may be greater than a power efficiency corresponding to a particular lobe of a dual-lobed output of a QCL that includes two flat facets (e.g., the FF-QCL 110 of FIG. 1).

The method of FIG. 5 may be initiated or controlled by a processing unit such as a central processing unit (CPU), an application-specific integrated circuit (ASIC), a controller, another hardware device, firmware device, or any combination thereof. As an example, the method of FIG. 5 can be initiated or controlled by a processor that executes instructions stored at a memory (e.g., a computer-readable storage device).

Figure 6:
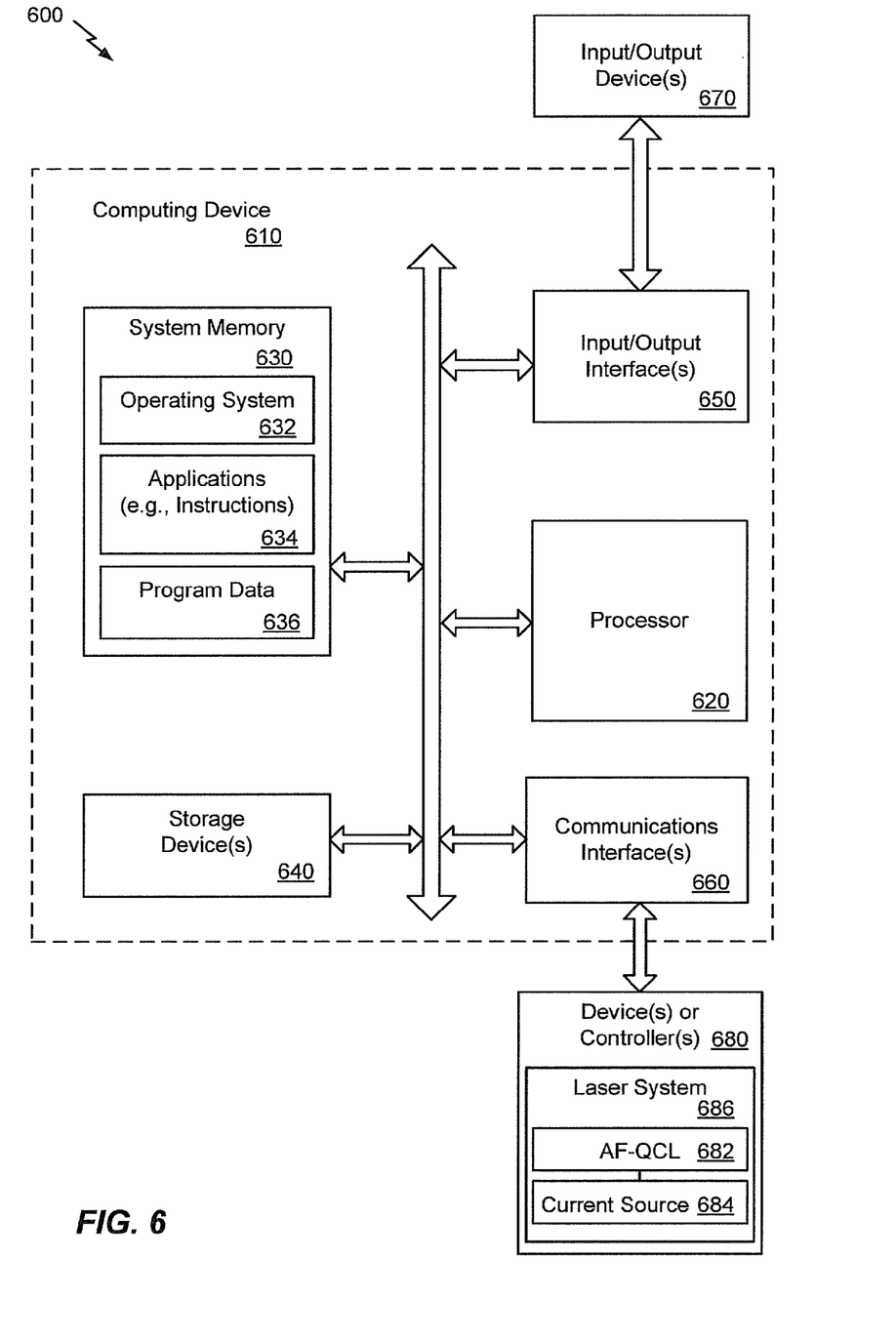
FIG. 6 is a block diagram illustrating a particular embodiment of a computing system configured to apply a current to a quantum cascade laser.

FIG. 6 is a block diagram of a computing environment 600 including a computing device 610 operable to control a quantum cascade laser (QCL) (e.g., an angled facet (AF) QCL). For example, the computing device 610, or portions thereof, may be configured to initiate or control applying a current to the ridge-guide 142 of FIG. 1, to the ridge-guide 210 of FIG. 2, to a ridge-guide of the AF-QCL 402 of FIG. 4, or a combination thereof.

The computing device 610 may include at least one processor 620. Within the computing device 610, the at least one processor 620 may communicate with a system memory 630, one or more storage devices 640, one or more input/output interfaces 650, one or more communications interfaces 660, or a combination thereof.

The system memory 630 may include volatile memory devices (e.g., random access memory (RAM) devices), nonvolatile memory devices (e.g., read-only memory (ROM) devices, programmable read-only memory, and flash memory), or both. The system memory 630 may include an operating system 632, which may include a basic input/output system for booting the computing device 610 as well as a full operating system to enable the computing device 610 to interact with users, other programs, and other devices. The system memory 630 may also include one or more applications (e.g., instructions) 634, and program data 636. The applications 634 may include instructions executable by the at least one processor 620 initiate or control applying a current to a ridge-guide of a QCL in response to an input signal.

The one or more storage devices 640 may include non-volatile storage devices, such as magnetic disks, optical disks, or flash memory devices. The storage devices 640 may include both removable and non-removable memory devices. In a particular embodiment, the storage devices 640 may be configured to store the operating system 632, the applications 634, the program data 636, or a combination thereof. The system memory 630, the storage devices 640, or both, may include tangible, non-transitory computer-readable media or storage devices.

In a particular embodiment, the at least one processor 620 is configured to execute computer executable instructions, such as the applications 634, stored at a non-transitory computer-readable medium, such as the system memory 630. The instructions may be executable to cause the at least one processor 620 to receive an input signal and to cause a current to be applied to a ridge-guide of a QCL in response to the input signal. The ridge-guide may be configured to emit output light from an angled facet of the ridge-guide in response to application of the current to the ridge-guide.

The one or more input/output interfaces 650 may enable the computing device 610 to communicate with one or more input/output devices 670 to facilitate user interaction. For example, the one or more input/output interfaces 650 may be adapted to receive input from a user, to receive input from another computing device, or a combination thereof. The input/output interfaces 650 may be configured to provide the input signal to the at least one processor 620 in response to input from a user. The input/output interfaces 650 may conform to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces. The input/output devices 670 may include user interface devices and displays, including some combination of buttons, keyboards, pointing devices, displays, speakers, microphones, touch screens, and other devices.

The one or more communications interfaces 660 may enable the computing device 610 to communicate with one or more other computing devices or controllers 680. The one or more communications interfaces 660 may include wired Ethernet interfaces, Institute of Electrical and Electronics Engineers (IEEE) 802 wireless interfaces, electrical (or power line) interfaces, optical or radio frequency interfaces, or other wired or wireless interfaces. The other computer devices or controllers 680 may include one or more laser systems 686, host computers, servers, workstations, portable computers, telephones, tablet computers, or any other communication device or component. The one or more laser systems 686 may include an AF-QCL 682, a current source 684, or a combination thereof. The current source 684 may be configured to provide a current to the AF-QCL 682 or to inject a current into a ridge-guide of the AF-QCL 682. For example, the other computer devices or controllers 680 may include the AF-QCL 140 of FIG. 1, a QCL that includes the ridge-guide 210 of FIG. 2, the AF-QCL 402 of FIG. 4, or other devices described with reference to FIGS. 1-5.

Figure 7:
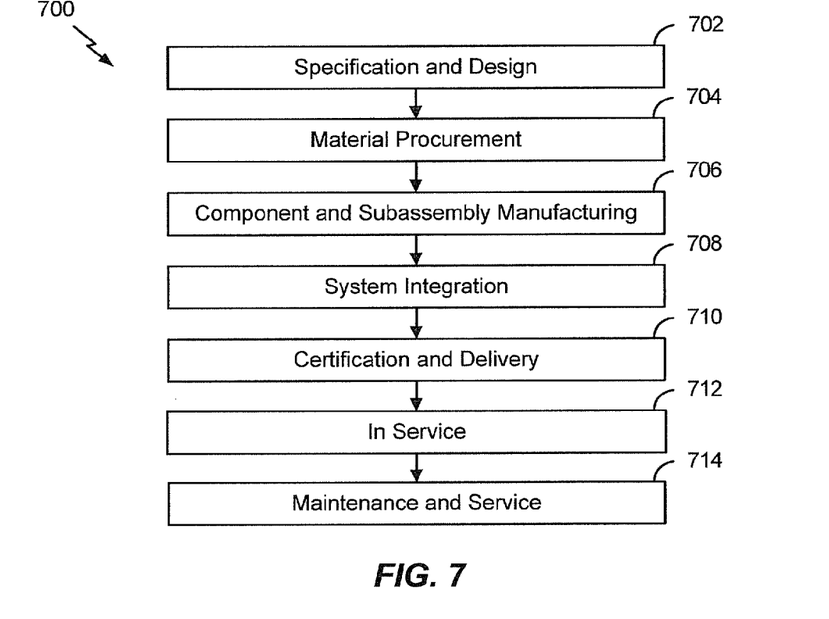
FIG. 7 is a flow diagram of a vehicle production and service methodology.
Figure 8:
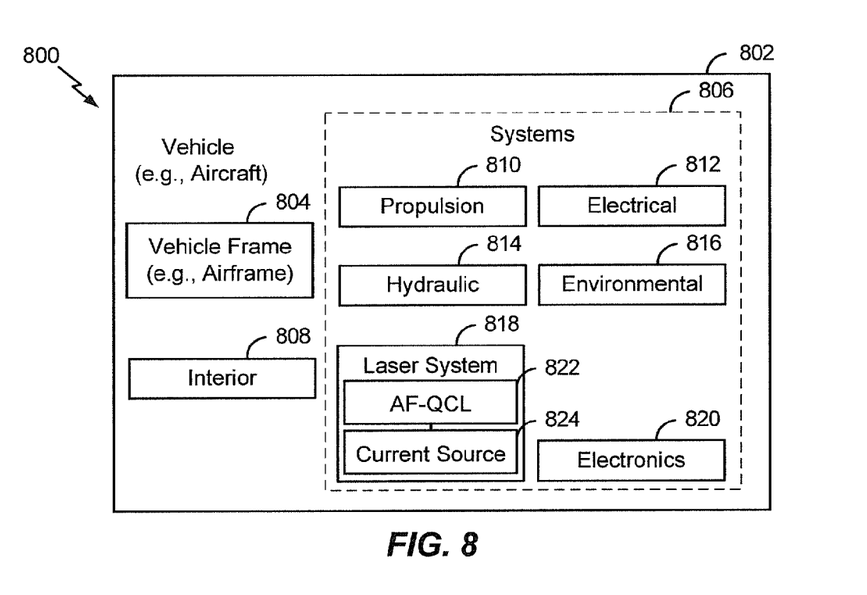
FIG. 8 is a block diagram of a vehicle including a quantum cascade laser.

Referring to FIGS. 7 and 8, examples of the disclosure are described in the context of a vehicle manufacturing and service method 700 as illustrated by the flow chart of FIG. 7 and a vehicle system 800 as illustrated by the block diagram of FIG. 8. A vehicle produced by the vehicle manufacturing and service method 700 of FIG. 7 and a vehicle 802 of FIG. 8 may include an aircraft, a watercraft, a land craft, a spacecraft, or combinations thereof. The service method 700 may also be modified to produce and service a structure, such as a building or a bridge, having one or more systems to operate or monitor the structure.

Referring to FIG. 7, during pre-production, the service method 700 may include specification and design 702 of the vehicle 802 and material procurement 704. For example, a laser system (e.g., a laser system 818 of FIG. 8) may be designed and specified.

During production, component and subassembly manufacturing 706 and system integration 708 of the vehicle 802 takes place. For example, the laser systems 818 may be produced as sub-assemblies and integrated within the vehicle 802. Thereafter, the vehicle 802 may go through certification and delivery 710 in order to be placed in service 712. While in service by a customer, the vehicle 802 may be scheduled for routine maintenance and service 714 (which may also include modification, reconfiguration, refurbishment, and so on). For example, when the laser systems 818 were not originally installed on the vehicle 802, the vehicle 802 may be reconfigured, during maintenance and service 714, to include the laser systems 818.

Each of the processes of the vehicle manufacturing and service method 700 may be performed or carried out by a system integrator, a third party, and/or an operator (e.g., a customer). For the purposes of this description, a system integrator may include without limitation any number of vehicle manufacturers and major-system subcontractors; a third party may include without limitation any number of venders, subcontractors, and suppliers; and an operator may be a transportation company (e.g., an airline), a leasing company, a military entity, a service organization, and so on.

As shown in FIG. 8, the vehicle system 800 includes the vehicle 802 produced by the vehicle manufacturing and service method 700. The vehicle 802 may include a vehicle frame 804 (e.g., an airframe) with a plurality of systems 806 and an interior 808. Examples of systems 806 include one or more of a propulsion system 810, an electrical system 812, a hydraulic system 814, an environmental system 816, the laser system 818, and an electronics system 820. Any number of other systems may be included. In a particular embodiment, the laser system 818 may be independent of or included in one or more of the other systems. The laser system 818 may include an angled facet quantum cascade laser (AF-QCL) 822, a current source 824, or a combination thereof.

Apparatus and methods embodied herein may be employed during any one or more of the stages of the vehicle manufacturing and service method 700. For example, components or subassemblies corresponding to a production process may be fabricated or manufactured in a manner similar to components or subassemblies produced while the vehicle 802 is in service. Also, one or more apparatus embodiments, method embodiments, or a combination thereof may be utilized during the production stages (e.g., the component subassembly manufacturing stage 706 and the system integration stage 708), for example, by substantially expediting assembly of or reducing the cost of the vehicle 802. Similarly, one or more of apparatus embodiments, method embodiments, or a combination thereof may be utilized while the vehicle 802 is in service, for example and without limitation, to maintenance and service 714.

In these illustrative examples, the laser system 818 may be implemented in the vehicle 802 during system integration 708 or maintenance and service 714. The laser system 818, in accordance with one or more embodiments disclosed herein, may be used while in service 712 and/or during maintenance and service 714. For example, the laser system 818 may be used as a component of an infrared jamming device and may be used to jam a targeting system of a heat-seeking missile.

Embodiments described above are illustrative and do not limit the disclosure. Numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it is to be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to fewer than all of the features of any of the disclosed embodiments.

What is claimed is:

1. A quantum cascade laser comprising:
a ridge-guide comprising:
an angled facet that extends across a width of the ridge-guide; and
a flat facet that extends across the width of the ridge-guide,
wherein a first distance between the flat facet and the angled facet along a first side of the ridge-guide is different than a second distance between the flat facet and the angled facet along a second side of the ridge-guide;
wherein the angled facet is configured to emit output light in response to current injection into the ridge-guide; and
wherein the output light forms a single lobe in a farfield.

2. The quantum cascade laser of claim 1, wherein the output light corresponds to an optical standing wave that extends between the angled facet and the flat facet.

3. The quantum cascade laser of claim 1, wherein the single lobe is formed in a direction that extends across the width of the ridge-guide.

4. The quantum cascade laser of claim 1, further comprising a substrate coupled to a surface of the ridge-guide perpendicular to the width of the ridge-guide and perpendicular to a direction corresponding to the first distance.

5. The quantum cascade laser of claim 4, wherein a surface of the ridge-guide opposite the substrate is gold plated.

6. The quantum cascade laser of claim 1, wherein the flat facet, the first side, and the second side are coated with a high-reflection coating.

7. The quantum cascade laser of claim 1, wherein the angled facet is formed by removing a portion of the ridge-guide.

8. The quantum cascade laser of claim 7, wherein the portion of the ridge-guide is removed using a focused ion-milling process, an etching process, or a combination thereof.

9. A method comprising:
receiving current at a ridge-guide of a quantum cascade laser, wherein the ridge-guide comprises a flat facet that extends across a width of the ridge-guide and an angled facet that extends across the width of the ridge-guide, and wherein a first distance between the flat facet and the angled facet along a first side of the ridge-guide is different than a second distance between the flat facet and the angled facet along a second side of the ridge-guide;
emitting output light from the angled facet of the ridge-guide in response to receiving the current; and
wherein the output light corresponds to an optical standing wave that extends between the angled facet and the flat facet and reflects off the first side and reflects off the second side.

10. The method of claim 9, wherein the output light forms a single lobe in a farfield.

11. The method of claim 10, wherein the single lobe is formed in a direction that extends across the width of the ridge-guide.

12. The method of claim 9, wherein the output light forms multiple lobes in a farfield.

13. The method of claim 9, wherein the optical standing wave intersects with the angled facet at a position between the first side and the second side.

14. The method of claim 13, wherein the position is halfway between a midpoint of the width of the ridge-guide and the first side.

15. The method of claim 9, wherein the optical standing wave intersects with the angled facet at a right angle.

16. An infrared countermeasure (IRCM) system comprising:
a warning sensor configured to detect a threat;
a tracking sensor configured, in response to receiving a threat indicator from the warning sensor, to acquire a position of the threat and to track the position of the threat; and
an angled facet quantum cascade laser (AF-QCL) configured to transmit output light energy to the position of the threat based on a tracking signal received from the tracking sensor, the AF-QCL comprising:
a ridge-guide comprising:
an angled facet that extends across a width of the ridge-guide; and
a flat facet that extends across the width of the ridge-guide,
wherein a first distance between the flat facet and the angled facet along a first side of the ridge-guide is different than a second distance between the flat facet and the angled facet along a second side of the ridge-guide; and
wherein the flat facet, the first side, and the second side are coated with a high-reflection coating.

17. The IRCM system of claim 16, further comprising an aircraft that comprises the warning sensor, the tracking sensor, and the AF-QCL.

18. The IRCM system of claim 16, wherein the output light energy is configured to jam a targeting system of the threat.

19. The IRCM system of claim 16, wherein the threat comprises a heat-seeking missile.

20. A quantum cascade laser comprising:
a ridge-guide comprising:
an angled facet that extends across a width of the ridge-guide; and
a flat facet that extends across the width of the ridge-guide,
wherein a first distance between the flat facet and the angled facet along a first side of the ridge-guide is different than a second distance between the flat facet and the angled facet along a second side of the ridge-guide; and
a substrate coupled to a surface of the ridge-guide perpendicular to the width of the ridge-guide and perpendicular to a direction corresponding to the first distance;
wherein a surface of the ridge-guide opposite the substrate is gold plated.

21. A quantum cascade laser comprising:
a ridge-guide comprising:
an angled facet that extends across a width of the ridge-guide; and a flat facet that extends across the width of the ridge-guide, wherein a first distance between the flat facet and the angled facet along a first side of the ridge-guide is different than a second distance between the flat facet and the angled facet along a second side of the ridge-guide; and wherein the flat facet, the first side, and the second side are coated with a high-reflection coating.

22. A method comprising:

receiving current at a ridge-guide of a quantum cascade laser, wherein the ridge-guide comprises a flat facet that extends across a width of the ridge-guide and an angled facet that extends across the width of the ridge-guide, and wherein a first distance between the flat facet and the angled facet along a first side of the ridge-guide is different than a second distance between the flat facet and the angled facet along a second side of the ridge-guide; and emitting output light from the angled facet of the ridge-guide in response to receiving the current;

wherein the output light forms a single lobe in a farfield.

* * * * *